(12) United States Patent
Kung (10) Patent No.: US 12,199,620 B2
(45) Date of Patent: Jan. 14, 2025

(54) CLOCK DATA RECOVERY CIRCUIT

(71) Applicant: HIMAX TECHNOLOGIES LIMITED, Tainan (TW)

(72) Inventor: Te Chieh Kung, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 27 days.

(21) Appl. No.: 18/304,332

(22) Filed: Apr. 20, 2023

(65) Prior Publication Data

US 2024/0356556 A1   Oct. 24, 2024

(51) Int. Cl.
*H03L 7/08* (2006.01)
*H03L 7/081* (2006.01)
*H03L 7/089* (2006.01)

(52) U.S. Cl.
CPC .......... *H03L 7/0807* (2013.01); *H03L 7/0812* (2013.01); *H03L 7/0891* (2013.01)

(58) Field of Classification Search
CPC ... H03L 7/0807; H03L 7/0812; H03L 7/0816; H03L 7/0891; H03L 7/0893; H03L 7/0895; H03L 7/085; H03L 7/087; H03L 7/089

See application file for complete search history.

(56) References Cited

U.S. PATENT DOCUMENTS

| | | | | |
|---|---|---|---|---|
| 7,602,223 B2 * | 10/2009 | Baek | ..................... | H03L 7/0891 327/158 |
| 8,531,221 B2 * | 9/2013 | Yang | ..................... | H03L 7/0812 327/157 |

* cited by examiner

*Primary Examiner* — Betsy Deppe
(74) *Attorney, Agent, or Firm* — JCIPRNET (57) ABSTRACT

A clock data recovery circuit is provided. The clock data recovery circuit includes a charge pump circuit, a voltage controlled delay line circuit, a charge pump current generator, a phase-frequency detector and a frequency detector. The charge pump circuit generates a control voltage according to a first control signal, a second control signal and a charge pump current. The voltage controlled delay line circuit generates a data clock signal according to the control voltage and a reference clock signal. The charge pump current generator generates the charge pump current to the charge pump circuit according to the control voltage. The phase-frequency detector generates the first control signal according to a feedback clock signal and the reference clock signal. The frequency detector generates the second control signal according to the feedback clock signal and the reference clock signal.

12 Claims, 6 Drawing Sheets

CLOCK DATA RECOVERY CIRCUIT

BACKGROUND

Technical Field

The disclosure relates a circuit, particularly, the disclosure relates to a clock data recovery circuit.

Description of Related Art

In general, the traditional clock data recovery (CDR) circuit cannot provide an effective clock data recovery function for data clock signals in a wide frequency range, because the charge pump current of the traditional clock data recovery circuit may be fixed. Furthermore, the different settings of charge pump current may have different effects on the data clock signal in different frequency bands, resulting in the traditional clock data recovery circuit having better clock data recovery capabilities for some frequency bands, but unlocking may occur for other frequency bands.

SUMMARY

The clock data recovery circuit of the disclosure includes a charge pump circuit, a voltage controlled delay line circuit, a charge pump current generator, a phase-frequency detector and a frequency detector. The charge pump circuit is configured to generate a control voltage according to a first control signal, a second control signal and a charge pump current. The voltage controlled delay line circuit is coupled to the charge pump circuit. The voltage controlled delay line circuit is configured to generate a data clock signal according to the control voltage and a reference clock signal. The charge pump current generator is coupled to the charge pump circuit. The charge pump current generator is configured to generate the charge pump current to the charge pump circuit according to the control voltage. The phase-frequency detector is coupled to the charge pump circuit. The phase-frequency detector is configured to generate the first control signal according to a feedback clock signal provided by the voltage controlled delay line circuit and the reference clock signal. The frequency detector is coupled to the charge pump circuit. The frequency detector is configured to generate the second control signal according to the feedback clock signal provided by the voltage controlled delay line circuit and the reference clock signal.

Based on the above, according to the clock data recovery circuit of the disclosure, the clock data recovery circuit can realize the clock data recovery function of the wide frequency range of the data clock signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . "

The term "coupling (or electrically connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device.

In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

Figure 1:
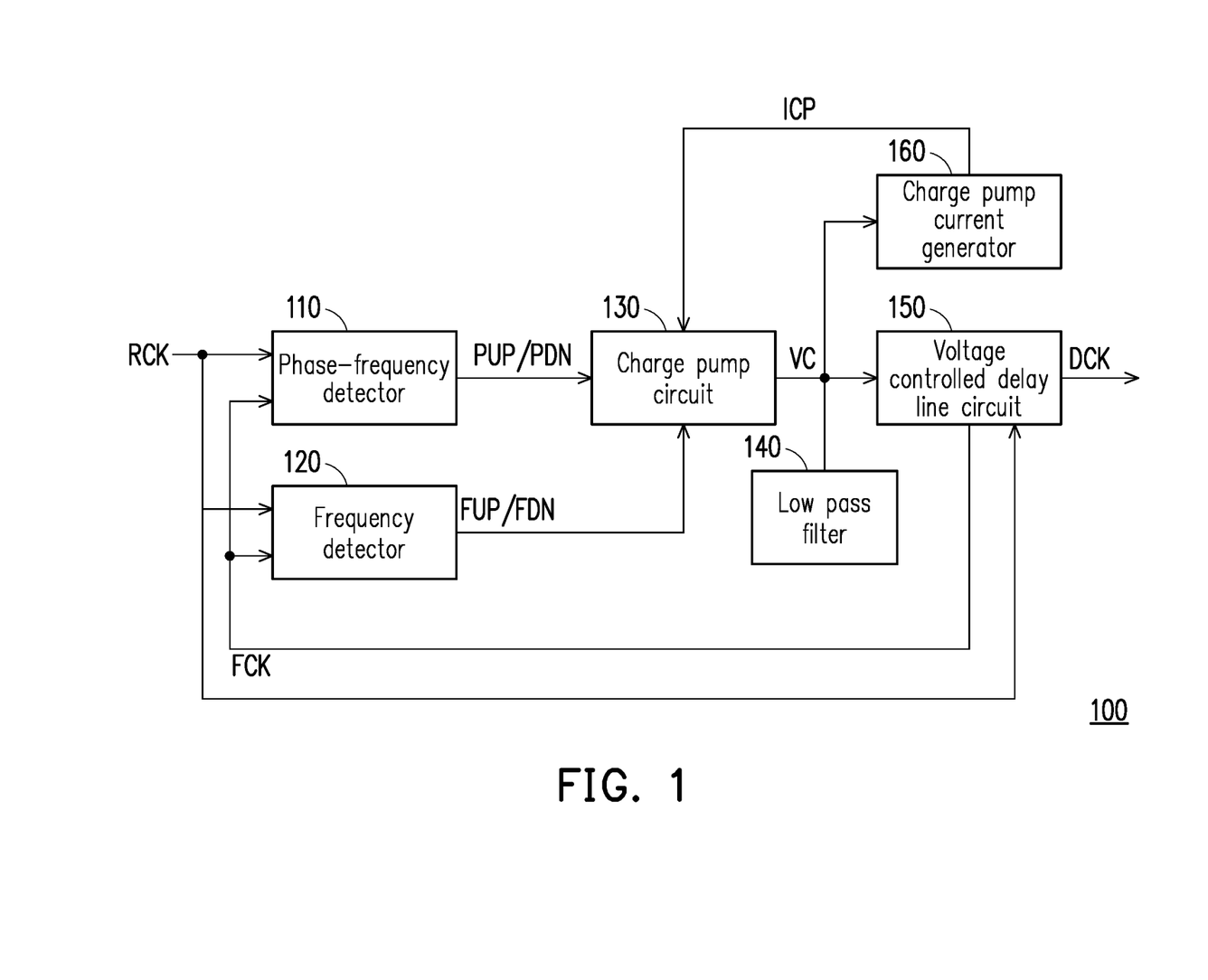
FIG. 1 is a schematic circuit diagram of a clock data recovery circuit according to an embodiment of the disclosure.

FIG. 1 is a schematic circuit diagram of a clock data recovery circuit according to an embodiment of the disclosure. Referring to FIG. 1, the clock data recovery (CDR) circuit 100 includes a phase-frequency detector 110, a frequency detector 120, a charge pump circuit 130, a low pass filter 140, a voltage controlled delay line (VCDL) circuit 150 and a charge pump current generator 160. The phase-frequency detector 110 is coupled to the charge pump circuit 130. The frequency detector 120 is coupled to the charge pump circuit 130. The charge pump circuit 130 is further coupled to the low pass filter 140, the voltage controlled delay line circuit 150 and the charge pump current generator 160. The voltage controlled delay line circuit 150 is further coupled to the phase-frequency detector 110 and the frequency detector 120.

In the embodiment of the disclosure, the phase-frequency detector 110 and the frequency detector 120, respectively, receive a reference clock signal RCK, and respectively receive a feedback clock signal FCK provided by the voltage controlled delay line circuit 150. The phase-frequency detector 110 is configured to generate the first control signal according to a feedback clock signal FCK and the reference clock signal RCK. The frequency detector 120 is configured to generate the second control signal according to the feedback clock signal FCK and the reference clock signal RCK. In the embodiment of the disclosure, the first control signal may be a phase up signal PUP or a phase down signal PDN, and the second control signal may be a frequency up signal FUP or a frequency down signal FDN.

Specifically, the phase-frequency detector 110 may compare the feedback clock signal FCK and the reference clock signal RCK. When the phase of the feedback clock signal FCK is delayed by the phase of the reference clock signal RCK, the phase-frequency detector 110 may output the phase up signal PUP. When the phase of the feedback clock signal FCK leads the phase of the reference clock signal RCK, the phase-frequency detector 110 may output the phase down signal PDN. Moreover, the frequency detector 120 may compare the feedback clock signal FCK and the reference clock signal RCK. When the frequency of the feedback clock signal FCK is higher than the frequency of the reference clock signal RCK, the frequency detector 120 may output the frequency down signal FDN. When the frequency of the feedback clock signal FCK is lower than the frequency of the reference clock signal RCK, the frequency detector 120 may output the frequency up signal FUP.

In the embodiment of the disclosure, the charge pump circuit 130 is configured to generate a control voltage VC according to the first control signal, the second control signal and a charge pump current ICP provided by the charge pump current generator 160. The voltage controlled delay line circuit is configured to generate a data clock signal DCK and the feedback clock signal FCK according to the control voltage VC and the reference clock signal RCK. The data clock signal DCK may be equal to the feedback clock signal FCK, but the disclosure is not limited thereto. The charge pump current generator is configured to generate the charge pump current ICP to the charge pump circuit 130 according to the control voltage VC. In addition, the low pass filter 140 is coupled to an output of the charge pump 130, so as to low pass filter the control voltage VC.

In addition, the clock data recovery circuit 100 may disposed in a source integrated circuit (IC) or a timing controller (TCON) to generate the data clock signal DCK for use by other function circuits, but the disclosure is not limited thereto.

Figure 2:
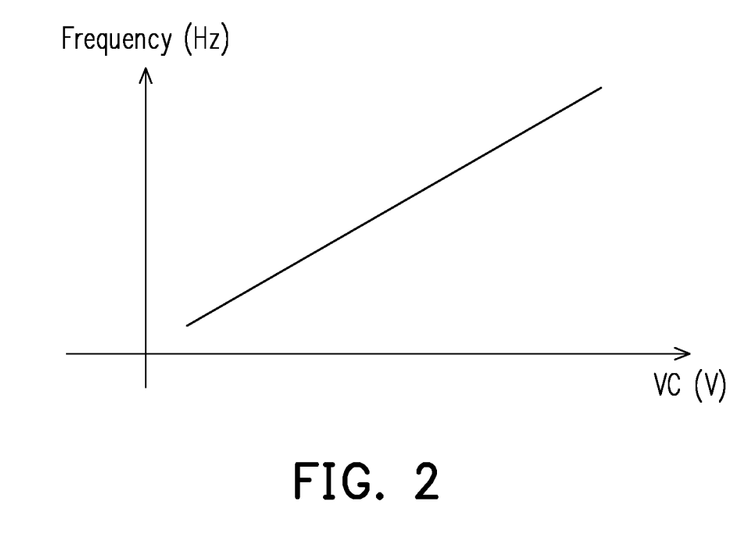
FIG. 2 is a schematic diagram of a relationship between a data voltage and a frequency of a data clock signal according to an embodiment of the disclosure.

FIG. 2 is a schematic diagram of a relationship between a data voltage and a frequency of a data clock signal according to an embodiment of the disclosure. Referring to FIG. 1 and FIG. 2, in the embodiment of the disclosure, the control voltage VC is positively associated with a frequency (or data rate) of the data clock signal DCK. When the reference clock signal RCK is (or change to) a low frequency clock signal, the charge pump circuit 130 may lower the control voltage VC, so that the voltage controlled delay line circuit 150 outputs the data clock signal DCK with a low frequency. When the reference clock signal RCK is (or change to) a high frequency clock signal, the charge pump circuit 130 may increase the control voltage VC, so that the voltage controlled delay line circuit 150 outputs the data clock signal DCK with a high frequency.

In the embodiment of the disclosure, the control voltage VC is determined by the charge pump current ICP and at least one of the first control signal and the second control signal. The charge pump current generator 160 generates the charge pump current ICP according to the control voltage VC. That is, when the clock data recovery circuit 100 performs a low frequency operation, the charge pump current generator 160 may dynamically reduce the charge pump current ICP. When the clock data recovery circuit 100 performs a high frequency operation, the charge pump current generator 160 may dynamically increase the charge pump current ICP. Therefore, the clock data recovery circuit 100 may effectively realize the clock data recovery function of the wide frequency range of the data clock signal DCK.

Figure 3:
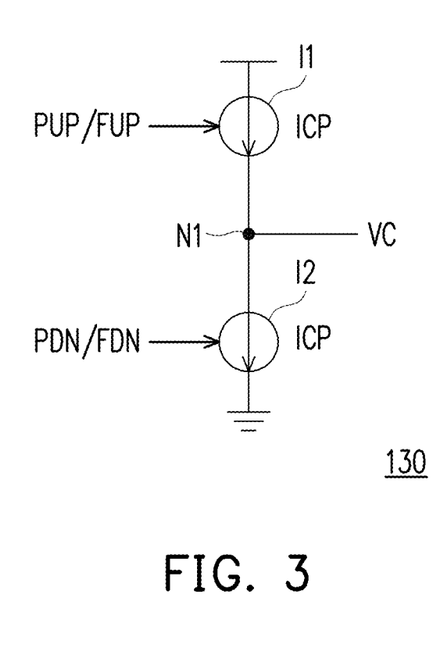
FIG. 3 is a schematic circuit diagram of a charge pump circuit according to an embodiment of the disclosure.

FIG. 3 is a schematic circuit diagram of a charge pump circuit according to an embodiment of the disclosure. Referring to FIG. 1 and FIG. 3, in the embodiment of the disclosure, the charge pump circuit 130 may include a first current source I1 and a second current source I2. The first current source I1 is coupled to a circuit node N1, and configured to selectively provide a forward current to the circuit node N1 according to the phase up signal PUP or the frequency up signal FUP. The second current source I2 is coupled to the first current source I1 through the circuit node N1, and configured to selectively provide a reverse current to the circuit node N1 according to the phase down signal PDN or the frequency down signal FDN.

In the embodiment of the disclosure, the first current source I1 may selectively output the charge pump current ICP provided by the charge pump current generator 160 to the circuit node N1 to form the forward current by controlling by the phase up signal PUP or the frequency up signal FUP, so that the control voltage VC may be increased accordingly. The second current source I2 may output the charge pump current ICP provided by the charge pump current generator 160 to an opposite direction of the circuit node N1 to form the reverse current by controlling by the phase down signal PDN or the frequency down signal FDN, so that the control voltage VC may be reduced accordingly. Therefore, the charge pump current generator 160 may dynamically adjust the control voltage VC according to the phase up signal PUP, the frequency up signal FUP, the phase down signal PDN or the frequency down signal FDN. Moreover, the charge pump current generator 160 may also dynamically adjust the control voltage VC according to the charge pump current ICP.

Figure 4:
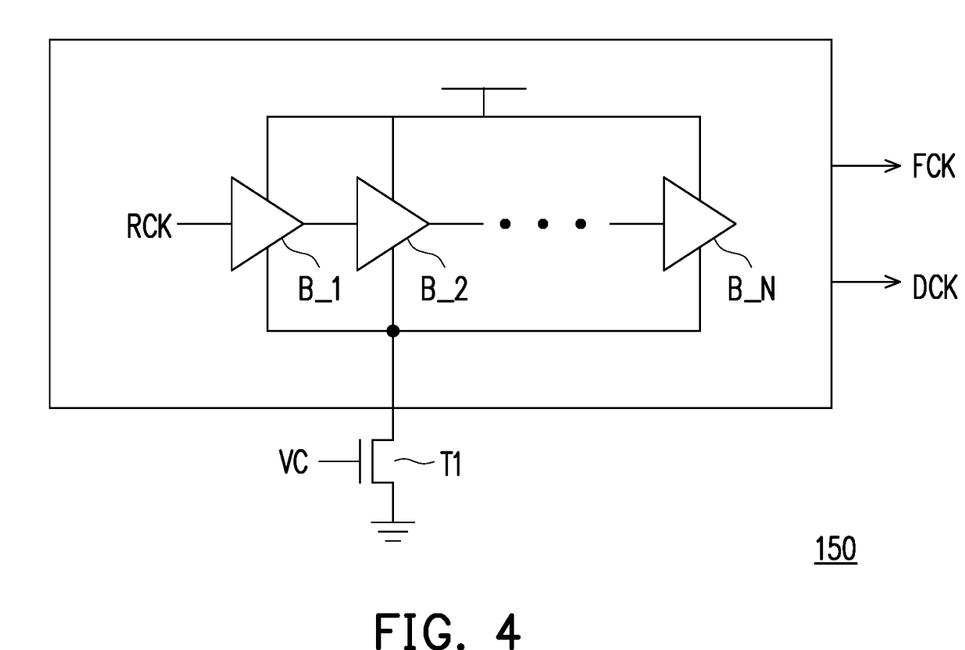
FIG. 4 is a schematic circuit diagram of a voltage controlled delay line circuit according to an embodiment of the disclosure.

FIG. 4 is a schematic circuit diagram of a voltage controlled delay line circuit according to an embodiment of the disclosure. Referring to FIG. 1 and FIG. 4, in the embodiment of the disclosure, the voltage controlled delay line circuit 150 includes a plurality of delay circuits B_1 to B_N and a transistor T1, where N is a positive integer. An input terminal of the delay circuit B_1 is configured to receive the reference clock signal RCK, an output terminal of the delay circuit B_1 is coupled to an input terminal of the delay circuit B_2. An output terminal of the delay circuit B_2 is coupled to an input terminal of the next delay circuit. Moreover, other delay circuits can be deduced by analogy. A first terminal of the transistor T1 is coupled to the delay circuits B_1 to B_N. A second terminal of the transistor T1 is coupled to a ground voltage. A control terminal of the transistor T1 receives the control voltage VC. The delay circuits B_1 to B_N are configured to receive the reference clock signal RCK, and generate the data clock signal DCK and the feedback clock signal FCK according to the reference clock RCK and the control voltage VC. In the embodiment of disclosure, the data clock signal DCK may be equal to the feedback clock signal FCK, but the disclosure is not limited thereto. In addition, the transistor T1 is an N-type transistor, but the disclosure is also not limited thereto.

Figure 5:
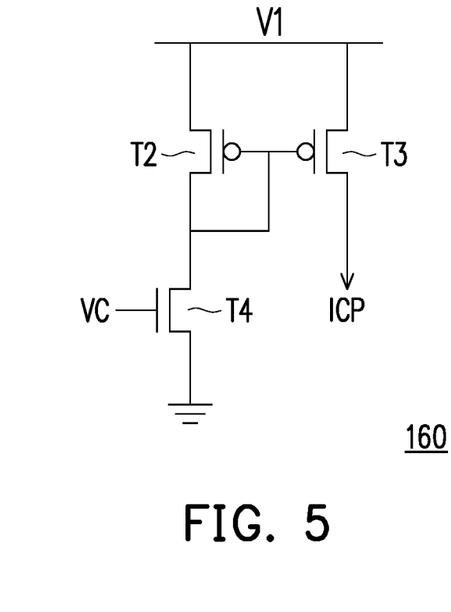
FIG. 5 is a schematic circuit diagram of a charge pump current generator according to an embodiment of the disclosure.

FIG. 5 is a schematic circuit diagram of a charge pump current generator according to an embodiment of the disclosure. Referring to FIG. 5, in the embodiment of disclosure, the charge pump current generator 160 includes a plurality of transistors T2 to T4. A first terminal of the transistor T2 is coupled to an operation voltage V1. A control terminal of the transistor T2 is coupled to a second terminal of the transistor T2. A first terminal of the transistor T3 is coupled to the operation voltage V1. A control terminal of the transistor T3 is coupled to the control terminal of the transistor T2. A second terminal of the transistor T3 outputs the charge pump current ICP. A first terminal of the transistor T4 is coupled to the second terminal of the transistor T2. A control terminal of the transistor T4 receives the control voltage VC. A second terminal of the transistor T4 is coupled to a ground voltage. In the embodiment of the disclosure, the transistor T2 and the transistor T3 are P-type transistors, and the transistor T4 is the N-type transistor, but the disclosure is not limited thereto. In the embodiment of the disclosure, when the transistor T4 is turned-on by the control voltage, the second terminals of the transistor T2 and the transistor T3 generate the charge pump current ICP based on the operation voltage V1. The transistor T2 and the transistor T3 may be configured as a current mirror circuit.

In addition, in one embodiment of the disclosure, the charge pump current generator 160 may also be disposed in the voltage controlled delay line circuit 150, but the disclosure is not limited thereto.

Figure 6:
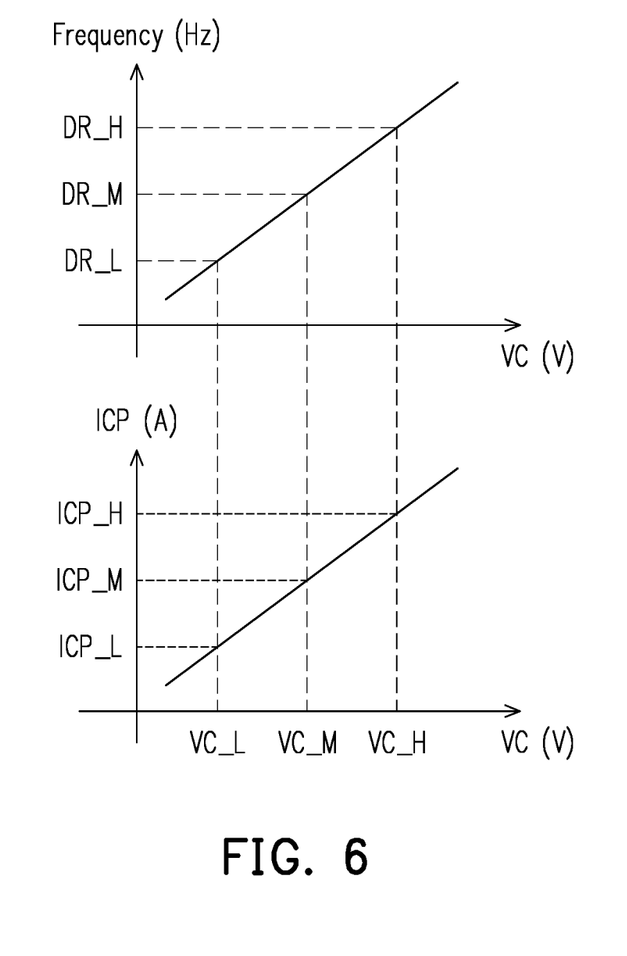
FIG. 6 is a schematic diagram of a relationship between a data voltage, a frequency of a data clock signal and a charge pump current according to an embodiment of the disclosure.

FIG. 6 is a schematic diagram of a relationship between a data voltage, a frequency of a data clock signal and a charge pump current according to an embodiment of the disclosure. Referring to FIG. 1, FIG. 5 and FIG. 6, in the embodiment of the disclosure, the control voltage VC is positively associated with a frequency of the data clock signal DCK, and the control voltage VC is positively associated with the charge pump current ICP. Thus, the charge pump current ICP is positively associated with the frequency of the data clock signal DCK.

For example, when the clock data recovery circuit 100 performs the low frequency operation to output the data clock signal DCK with a low data rate (frequency) DR_L, the control voltage VC may be a corresponding low voltage VC_L, and the control voltage VC is determined by a corresponding low charge pump current ICP_L (e.g. 8X current). When the clock data recovery circuit 100 performs the medium frequency operation to output the data clock signal DCK with a medium data rate DR_M, the control voltage VC may be a corresponding medium voltage VC_M, and the control voltage VC is determined by a corresponding medium charge pump current ICP_M (e.g. 12X current). When the clock data recovery circuit 100 performs the high frequency operation to output the data clock signal DCK with a high data rate DR_H, the control voltage VC may be a corresponding high voltage VC_H, and the control voltage VC is determined by a corresponding high charge pump current ICP_H (e.g. 20X current).

Therefore, due to the charge pump current generator 160 may dynamically adjust the charge pump current ICP according to the control voltage VC, and the control voltage VC is changed in response to the data rate (frequency) of the data clock signal DCK, thus the clock data recovery circuit 100 may effectively realize the clock data recovery function of the wide frequency range of the data clock signal DCK.

In summary, the clock data recovery circuit of the disclosure is capable of providing the effective clock data recovery function of the wide frequency range of the data clock signal. The charge pump current of the clock data recovery circuit may be depended on the frequency of the data clock signal by depending the control voltage, so that the charge pump current may be adaptively and dynamically adjusted to adapt the frequency of the data clock signal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A clock data recovery circuit, comprising:
   a charge pump circuit, configured to generate a control voltage according to a first control signal, a second control signal and a charge pump current;
   a voltage controlled delay line circuit, coupled to the charge pump circuit, and configured to generate a data clock signal according to the control voltage and a reference clock signal;
   a charge pump current generator, coupled to the charge pump circuit, and configured to generate the charge pump current to the charge pump circuit according to the control voltage;
   a phase-frequency detector, coupled to the charge pump circuit, and configured to generate the first control signal according to a feedback clock signal provided by the voltage controlled delay line circuit and the reference clock signal; and
   a frequency detector, coupled to the charge pump circuit, and configured to generate the second control signal according to the feedback clock signal provided by the voltage controlled delay line circuit and the reference clock signal.

2. The clock data recovery circuit according to claim 1, wherein the first control signal is a phase up signal or a phase down signal.

3. The clock data recovery circuit according to claim 1, wherein the second control signal is a frequency up signal or a frequency down signal.

4. The clock data recovery circuit according to claim 1, wherein the charge pump circuit comprises:
   a first current source, coupled to a circuit node, and configured to selectively provide a forward current to the circuit node according to the first control signal and the charge pump current; and
   a second current source, coupled to the first current source through the circuit node, and configured to selectively provide a reverse current to the circuit node according to the second control signal and the charge pump current,
   wherein the circuit node is configured to provide the control voltage according to the forward current or the reverse current.

5. The clock data recovery circuit according to claim 1, wherein the voltage controlled delay line circuit comprises:
   a plurality of delay circuits, configured to receive the reference clock signal and generate the data clock signal according to the reference clock; and
   a first transistor, coupled to the plurality of delay circuits, receives the control voltage.

6. The clock data recovery circuit according to claim 1, wherein the charge pump current generator comprises:
   a first transistor, wherein a first terminal of the first transistor is coupled to an operation voltage and a control terminal of the first transistor is coupled to a second terminal of the first transistor;

a second transistor, wherein a first terminal of the second transistor is coupled to the operation voltage, a control terminal of the second transistor is coupled to the control terminal of the first transistor, and a second terminal of the second transistor outputs the charge pump current; and a third transistor, wherein a first terminal of the third transistor is coupled to the second terminal of the first transistor, a control terminal of the third transistor receive receives the control voltage, and a second terminal of the third transistor is coupled to a ground voltage.

7. The clock data recovery circuit according to claim 6, wherein the first transistor and the second transistor are P-type transistors.

8. The clock data recovery circuit according to claim 1, wherein the control voltage is positively correlated to a frequency of the data clock signal.

9. The clock data recovery circuit according to claim 1, wherein the control voltage is positively correlated with the charge pump current.

10. The clock data recovery circuit according to claim 1, wherein the charge pump current is positively correlated with a frequency of the data clock signal.

11. The clock data recovery circuit according to claim 1, further comprising:

a low pass filter coupled to an output of the charge pump.

12. The clock data recovery circuit according to claim 1, wherein the charge pump current generator is disposed in the voltage controlled delay line circuit.

* * * * *